(12) United States Patent
Matsubara et al.

(10) Patent No.: US 7,368,398 B2
(45) Date of Patent: May 6, 2008

(54) SUBSTRATE PROCESSING APPARATUS AND SUBSTRATE PROCESSING METHOD

(75) Inventors: Toshio Matsubara, Toyama (JP); Hiroyuki Satoh, Toyama (JP); Hideto Uchijima, Toyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 1 day.

(21) Appl. No.: 11/255,015

(22) Filed: Oct. 21, 2005

(65) Prior Publication Data
US 2006/0086463 A1    Apr. 27, 2006

(30) Foreign Application Priority Data
Oct. 21, 2004  (JP) ............................. 2004-307060

(51) Int. Cl.
*H01L 21/31* (2006.01)
(52) U.S. Cl. ...................... 438/758; 438/107
(58) Field of Classification Search ................ 438/758, 438/107
See application file for complete search history.

(56) References Cited

U.S. PATENT DOCUMENTS

| | | | |
|---|---|---|---|
| 5,581,874 A * | 12/1996 | Aoki et al. ................... | 29/825 |
| 5,998,303 A * | 12/1999 | Sato ........................... | 438/758 |
| 6,300,255 B1 * | 10/2001 | Venkataranan et al. ..... | 438/787 |
| 6,830,652 B1 * | 12/2004 | Ohmi et al. ............ | 156/345.41 |
| 2001/0019777 A1 * | 9/2001 | Tanaka et al. ............ | 428/472.2 |
| 2003/0209323 A1 | 11/2003 | Yokogaki | |
| 2005/0223986 A1 * | 10/2005 | Choi et al. .................. | 118/715 |
| 2006/0228496 A1 * | 10/2006 | Choi et al. .................. | 427/569 |

FOREIGN PATENT DOCUMENTS

| | | |
|---|---|---|
| JP | 11-360143 A | 12/1989 |
| JP | 06-204181 | 7/1994 |
| JP | 09-036046 | 2/1997 |
| JP | 9-129615 A | 5/1997 |
| JP | 9-129615 A | 6/1997 |
| JP | 11-350143 A | 12/1999 |
| JP | 2000-273638 | 10/2000 |
| JP | 2003-324072 A | 11/2003 |

* cited by examiner

*Primary Examiner*—Walter Lindsay, Jr.
*Assistant Examiner*—Abdulfattah Mustapha
(74) *Attorney, Agent, or Firm*—McDermott Will & Emery LLP (57) ABSTRACT

A substrate processing apparatus includes a reaction chamber with a structure allowing pressure reduction, a shower head for supplying a processing gas into the reaction chamber including a gas diffusion plate in which through holes are formed, and a substrate support for placing a substrate. Each ones of through holes provided in a peripheral region of the gas diffusion plate is formed so that an area of an inlet thereof is larger than an area of an outlet thereof. With use of the substrate processing apparatus, a processing gas can be supplied uniformly in the gas diffusion plate. Therefore, substrate processing such as film deposition and film etching can be uniformly performed.

16 Claims, 5 Drawing Sheets

SUBSTRATE PROCESSING APPARATUS AND SUBSTRATE PROCESSING METHOD

CROSS-REFERENCE TO RELATED APPLICATION

This application claims priority under 35 U.S.C. §119(a) on Japanese Patent Application No. 2004-307060 filed on Oct. 21, 2004, the entire contents of which are hereby incorporated by reference.

BACKGROUND OF THE INVENTION

1. Field of the Invention

The present invention relates to substrate processing such as film formation performed using a chemical vapor deposition apparatus and fine processing performed using a dry etching apparatus, and more particularly relates to a technique for improving uniformity of processing.

2. Prior Art

In recent years, there has been a trend where the degree of integration of semiconductor integrated circuit devices is further increased whereas the power consumption thereof is further reduced. Meanwhile, costs in semiconductor integrated circuit device fabrication have been reduced by increase in the diameter of semiconductor substrates and the like. In order to reduce pattern dimensions of an element in such a semiconductor integrated circuit device while increasing the diameter of a semiconductor substrate, it is necessary to suppress variation in the thickness of an insulation film which is a member of the semiconductor integrated circuit device in fabrication process steps and to uniformly perform dry etching to an entire surface of the substrate.

Figure 6:
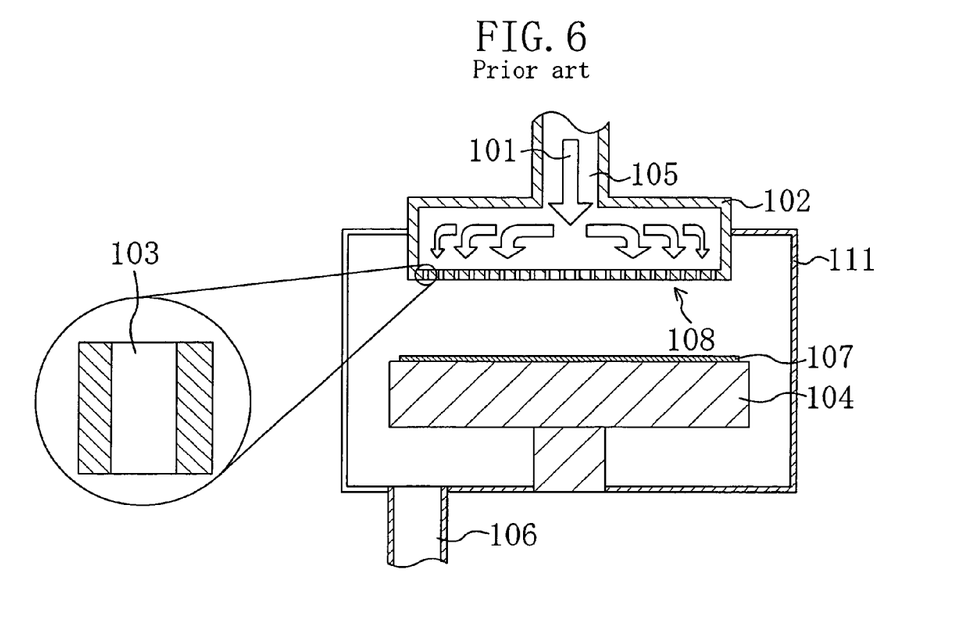
FIG. 6 is a cross-sectional view illustrating an exemplary known chemical vapor deposition apparatus.

FIG. 6 is a cross-sectional view illustrating an exemplary known chemical vapor deposition (CVD) apparatus for forming a thin film such as a silicon oxide film and polysilicon on a semiconductor substrate. With the recent trend of increase in the diameter of semiconductor substrates, the use of such a single-wafer-processing apparatus as the CVD apparatus of FIG. 6 is the mainstream. FIG. 6 shows a thermal reaction type CVD apparatus.

The known chemical vapor deposition apparatus of FIG. 6 includes a reaction chamber 111 for forming a film on a semiconductor substrate 107, a shower head 102 for supplying a source gas 101 used in film formation, a gas inlet 105, connected to upper part of the shower head 102, for introducing the source gas 101 to the shower head 102, a substrate support 104, disposed in the reaction chamber 111, for placing the semiconductor substrate 107, and an outlet 106 connected to the reaction chamber 111 and a pump (not shown) for exhausting gas in the reaction chamber 111.

A gas diffusion plate 108 in which a large number of small through holes 103 for discharging the source gas 101 to the inside of the reaction chamber 111 are provided is attached to a (lower) side of the shower head 102 facing the substrate support 104. The gas diffusion plate 108 forms a hollow portion together with a main body of the shower head 102. The substrate support 104 includes a heater for adjusting a temperature of the semiconductor substrate 107 therein and the semiconductor substrate 107 is disposed on the substrate support 104 so as to face the gas diffusion plate 108.

The gas diffusion plate 108 can be also formed as a united body with the shower head 102. In such a case, however, processing and maintenance of the gas diffusion plate 108 would become complicated. Therefore, the gas diffusion plate 108 is usually a removable separate member.

When a thin film is formed using the known chemical vapor deposition apparatus having the above-described structure, first, the semiconductor substrate 107 is placed on the substrate support 104 in the reaction chamber 111 and is heated to a predetermined temperature. Then, while exhausting the reaction chamber 111 through the outlet 106 using the pump, the source gas 101 which is necessary for forming a film is introduced into the reaction chamber 111 through the gas inlet 105, thereby forming a thin film on the semiconductor substrate 107 in the form of a wafer.

The gas diffusion plate 108 has a disc shape and, in the gas diffusion plate 108, the small through holes 103 with a diameter of about 0.5 mm are formed so as to spread uniformly throughout substantially a whole surface of the diffusion plate 108. As shown in an enlarged view of FIG. 6, the longitudinal section of each of the through holes 103 have the same shape at any point from the gas inlet to the outlet. With the gas diffusion plate 108, the source gas 101 introduced into the hollow portion from substantially center part of the shower head 102 through the gas inlet 105 can be discharged into the reaction chamber 111 so as to be diffused uniformly in the horizontal direction. Therefore, the thickness of a thin film deposited on the semiconductor substrate 107 can be made uniform. A chemical vapor deposition apparatus using the gas diffusion plate is disclosed, for example, in Japanese Laid-Open Publication No. 2000-273638. Moreover, for dry etching apparatuses, a structure of an etching gas diffusion plate formed with improved etching uniformity is disclosed in Japanese Laid-Open Publication No. 6-204181.

However, as the size of elements in the semiconductor integrated circuit devices is further reduced in future and more precise process control is required, it becomes difficult to deposit, using the shower head 102 in the known chemical vapor deposition apparatus of FIG. 6, a film with sufficiently high uniformity of film thickness for fabricating a semiconductor integrated circuit device with high yield.

The through holes 103 are formed substantially throughout a whole surface of the gas diffusion plate 108 with a substantially uniform density. In this case, the source gas 101 is supplied more around inlets of ones of the through holes 103 located in the center part of the gas diffusion plate 108 and less around inlets of some other ones of the through holes 103 located at greater distance from the gas inlet 105 in peripheral part of the gas diffusion plate 108. Thus, it is assumed that the flow rate of a source gas discharged into the reaction chamber 111 varies depending on the locations of the through holes 103 and a nonuniform distribution of the thickness of a thin film is caused depending on the location of the semiconductor substrate 107 placed so as to face the gas diffusion plate 108.

It is desirable that during film formation using the chemical vapor deposition apparatus of FIG. 6, the pressure of the source gas 101 ideally becomes uniform at the whole surface of the gas diffusion plate and the flow rate of gas flowing through the through holes located around the center part of the shower head 102 and the flow rate of gas flowing through the through holes located in the peripheral part are the same. However, in actual fact, the pressure of the source gas 101 in the shower head 102 is lower in the peripheral part than in the center part for the above-described reason and thus the flow rate of gas flowing through the through holes located in the peripheral part becomes lower than the flow rate of gas flowing through the through holes located around the center part. As a result, gas is supplied less in peripheral part of the semiconductor substrate 107 and more around center part of the semiconductor substrate 107 and thus the thickness of a thin film formed on the semiconductor substrate 107 becomes small in the peripheral part of the semiconductor substrate 107.

The technique for improving nonuniformity in a single-wafer-processing apparatus for processing a substrate is disclosed in Japanese Laid-Open Publication No. 6-204181. The disclosed technique is for use in a dry-etching apparatus. According to the disclosed technique, in order to achieve uniform density for a reaction gas flowing from an entire surface of an electrode plate, small through holes are formed in center part of the electrode plate and large through holes are formed in peripheral part of the electrode plate. That is, through holes are formed so that a distribution of the size of the through holes becomes nonuniform. According to the method disclosed in Japanese Laid-Open Publication No. 6-204181, by properly setting a distribution of size of the through holes, etching uniformity can be improved to 3.3%. In general, a maximum etching rate and a minimum etching rate in a wafer are compared to each other and etching uniformity is obtained by using 100×((variation in etching rate)/(average etching rate))/2 (%), i.e., 100×((maximum etching rate−minimum etching rate)/(average etching rate for measurement points))/2 (%). However, to fabricate a fine semiconductor integrated circuit having a dimension of ¼ μm or less, the above-described etching uniformity is not sufficient, and higher uniformity is required. Moreover, it can be assumed that if the technique is used for a gas diffusion plate in a chemical vapor deposition apparatus, uniformity of flow rate distribution of a source gas can not reach a sufficiently high level for fabricating a semiconductor integrated circuit.

In addition, when through holes and the distribution of the through holes are adjusted to improve uniformity of substrate processing by the above-described method, as disclosed in Japanese Laid-Open Publication No. 6-204181, uniformity of substrate processing might be deteriorated to be 10% or more even in the case of fine adjustment. That is, according to the known method, uniformity sensitively varies with respect to adjustment of the through holes and the distribution of the through holes and therefore it is very difficult to achieve uniformity of 3% on an average or higher uniformity.

SUMMARY OF THE INVENTION

In view of the above-described problems, the present invention has been devised. It is therefore an object of the present invention to provide substrate processing apparatus and method which allow performing uniform substrate processing such as CVD and dry etching on an upper surface of a wafer.

To solve the above-described problems, a first substrate processing apparatus according to the present invention includes: a reaction chamber for processing a substrate using a processing gas; a shower head for supplying the processing gas into the reaction chamber, the shower head including a gas diffusion plate which has a plate shape and a plurality of through holes for passing the processing gas; and a substrate support for placing the substrate so that the substrate faces the gas diffusion plate, the substrate support being provided in the reaction chamber. In the first substrate processing apparatus, each one of the plurality of through holes provided in a peripheral region of the gas diffusion plate is formed so that an area of an inlet thereof is larger than an area of an outlet thereof.

In this structure, a difference between the amount of a process gas discharged from through holes provided in a peripheral portion of the gas diffusion plate and the amount of the process gas discharged from through holes provided in some other part of the gas diffusion plate can be made smaller. Therefore, substrate processing can be uniformly performed on an upper surface of a wafer. In this case, substrate processing includes, for example, film deposition by CVD and dry etching such as plasma etching.

In one embodiment of the present invention, each one of the plurality of through holes provided in the center region of the gas diffusion plate is formed in a pillar shape so that an area of an inlet thereof is substantially equal to an area of an outlet thereof. Thus, the amount of a discharged processing gas can be equalized in the gas diffusion plate.

It is preferable that a difference between respective areas of the inlet and outlet of one of the plurality of through holes provided in the peripheral region of the gas diffusion plate is larger at a greater distance from the center region of the gas diffusion plate. Thus, ones of the through holes provided at a greater distance from the center region of the gas diffusion plate can take in a larger amount of a processing gas. As a result, a difference in the density of a process gas in part of the shower head over the gas diffusion plate can be corrected and thus a substrate can be uniformly processed. Specifically, when the through holes are formed using a drill, uniform substrate processing can be performed with high accuracy by adjusting a difference in area between the inlet and outlet thereof.

In one embodiment of the present invention, each one of the through holes provided in the peripheral region comprises an inlet-side portion including the inlet and an outlet-side portion including the outlet, each of the inlet- and outlet-side portions is formed in a pillar shape so as to have a certain opening area, and the opening area of the outlet-side portion is smaller than the opening area of the inlet-side portion. Thus, substrate processing can be uniformly performed and also the through holes of the gas diffusion plate can be processed in a simple manner.

In one embodiment of the present invention, a depth of the inlet-side portion of one of the plurality of through holes provided in the peripheral region is larger at a greater distance from the center region. Thus, resistance against a processing gas flowing through the through holes can be adjusted, so that the amount of a processing gas discharged from the plurality of through holes provided in the gas diffusion plate can be made uniform. As a result, a substrate can be uniformly processed on an upper surface of a wafer. Specifically, when the through holes are formed using a drill, by adjusting the depth of the inlet-side portions, substrate processing can be uniformly performed with high accuracy.

It is preferable that a depth of the inlet-side potion of one of the plurality of through holes provided in the peripheral portion is more than 0 mm and ½ or less of a thickness of the gas diffusion plate.

The shower head may have a hollow therein and may further comprise a gas inlet for introducing the processing gas to the hollow, the gas inlet being provided so as to overlap the center region of the gas diffusion plate when viewed from the top, and the gas diffusion plate may be removable from a main body of the shower head. Thus, processing and maintenance of the shower head and the gas diffusion plate becomes simple.

In one embodiment of the present invention, each of the plurality of through holes has a circular shape when viewed from the top. Thus, formation of through holes is preferably performed in a simple manner.

A second substrate processing apparatus according to the present invention includes: a reaction chamber for processing a substrate using a processing gas; a first shower head for discharging the processing gas, the first shower head including a first gas diffusion plate which has a plate shape and a plurality of first through holes for passing the processing gas; a second shower head for supplying the processing gas into the reaction chamber, the second shower head including a second gas diffusion plate which has a plate shape and a plurality of second through holes for passing the processing gas and being provided so as to surround the first shower head; and a substrate support for placing the substrate so that the substrate faces the second gas diffusion plate, the substrate support being provided in the reaction chamber. In the second substrate processing apparatus, each one of the plurality of first through holes provided in a peripheral region of the first gas diffusion plate is formed so that an area of an inlet thereof is larger than an area of an outlet thereof.

Thus, the amount of the processing gas discharged from the first gas diffusion plate becomes uniform on an upper surface of the plate. Accordingly, the amount of the processing gas discharged from the second shower head to an upper surface of the substrate can be made uniform on an upper surface of the substrate. As a result, substrate processing can be uniformly performed to the upper surface of the substrate.

Moreover, in one embodiment of the present invention, each one of the plurality of second through holes provided in a peripheral region of the second gas diffusion plate is formed so that an area of an inlet thereof is larger than an area of an outlet thereof. Thus, a distribution of the density of the processing gas in the peripheral region can be corrected at two stages. Therefore, the amount of the processing gas discharged from the plurality of second through holes can be made further uniform.

It is preferable that each one of the plurality of first through holes provided in a center region of the first gas diffusion plate is formed in a pillar shape so that an area of an inlet thereof is substantially equal to an area of an outlet thereof, and each one of the plurality of second through holes provided in the center region of the second gas diffusion plate is formed in a pillar shape so that an area of an inlet thereof is substantially equal to an area of an outlet thereof.

In one embodiment of the present invention, each one of the first through holes provided in the peripheral region of the first gas diffusion plate comprises an inlet-side portion including the inlet and an outlet-side portion including the outlet, each of the inlet- and outlet-side portions is formed in a pillar shape so as to have a certain opening area, and the opening area of the outlet-side portion is smaller than the opening area of the inlet-side portion. Thus, substrate processing can be uniformly performed and also processing of the gas diffusion plate becomes simple.

In one embodiment of the present invention, a depth of the inlet-side portion of one of the plurality of first through holes provided in the peripheral region of the first gas diffusion plate is larger at a greater distance from the center region of the first gas diffusion plate. Thus, resistance against a processing gas flowing through the first through holes can be adjusted, so that the amount of the processing gas discharged from the plurality of first through holes provided in the gas diffusion plate can be made uniform. As a result, a substrate can be uniformly processed on an upper surface of a wafer. Specifically, when the through holes are formed using a drill, substrate processing can be uniformly performed with high accuracy by adjusting the depth of the inlet-side portions.

The first shower head may have a hollow therein and may further comprise a gas inlet for introducing the processing gas to the hollow, the gas inlet being provided so as to overlap the center region of the first gas diffusion plate when viewed from the top, and the first gas diffusion plate may be removable from a main body of the first shower head.

A third substrate processing apparatus according to the present invention includes: a reaction chamber for processing a substrate using a processing gas; a first shower head for discharging the processing gas, the first shower head including a first gas diffusion plate which has a plate shape and a plurality of first through holes for passing the processing gas; a second shower head for supplying the processing gas into the reaction chamber, the second shower head including a gas diffusion plate which has a plate shape and a plurality of second through holes for passing the processing gas and being provided so as to surround the first shower head; and a substrate support for placing the substrate so that the substrate faces the second gas diffusion plate, the substrate support being provided in the reaction chamber. In the third substrate processing apparatus, each one of the plurality of second through holes provided in a peripheral region of the second gas diffusion plate is formed so that an area of an inlet thereof is larger than an area of an outlet thereof.

In this structure, variation in the amount of the processing gas discharged from the first gas diffusion plate can be corrected with the second gas diffusion plate. Accordingly, the amount of the processing gas discharged to an upper surface of the substrate can be made uniform in the upper surface of the substrate. As a result, substrate processing can be uniformly performed on the upper surface of the substrate.

Each one of the plurality of first through holes provided in a center region of the first gas diffusion plate may be formed in a pillar shape so that an area of an inlet thereof is substantially equal to an area of an outlet thereof, and each one of the plurality of second through holes provided in a center region of the second gas diffusion plate may be formed in a pillar shape so that an area of an inlet thereof is substantially equal to an area of an outlet thereof.

It is preferable that each one of the second through holes provided in the peripheral region of the second gas diffusion plate comprises an inlet-side portion including the inlet and an outlet-side portion including the outlet, each of the inlet- and outlet-side portions is formed in a pillar shape so as to have a certain opening area, and the opening area of the outlet-side portion is smaller than the opening area of the inlet-side portion.

It is preferable that a depth of the inlet-side portion of one of the plurality of second through holes provided in the peripheral region of the second gas diffusion plate is larger at a greater distance from the center region of the second gas diffusion plate. Thus, when the through holes are formed using a drill, substrate processing can be uniformly performed with high accuracy by adjusting the depth of the inlet-side portions.

A method for processing a substrate according to the present invention is a method for processing a substrate using a substrate processing apparatus including a reaction chamber, a shower head which includes a gas diffusion plate having a plate shape and through holes for passing a processing gas in peripheral and center regions thereof, each one of the through holes provided in a peripheral portion being formed so that an area of an inlet thereof is larger than an area of an outlet thereof, and supplies the processing gas into the reaction chamber, and a substrate support for placing the substrate so that the substrate faces the gas diffusion plate, the method comprising the process steps of: a) placing the substrate on the substrate support; and b) supplying the processing gas to the reaction chamber through the through holes formed in the center and peripheral regions of the gas diffusion plate to perform processing to the substrate.

According to this method, ones of the through holes provided in the peripheral region of the gas diffusion plate can take in a larger amount of a processing gas. Accordingly, variation in the amount of the processing gas discharged from the through holes can be reduced. As a result, substrate processing can be uniformly performed on an upper surface of a substrate in the step b).

It is preferable that each one of the through holes provided in the center region of the gas diffusion plate is formed in a pillar shape so that an area of an inlet thereof is substantially equal to an area of an outlet thereof.

Moreover, in one embodiment of the present invention, each one of the through holes provided in the peripheral region of the gas diffusion plate comprises an inlet-side portion including the inlet and an outlet-side portion including the outlet, each of the inlet- and outlet-side portions is formed in a pillar shape so as to have a certain opening area, and a depth of the inlet-side portion is larger at a greater distance from the center region. Thus, in the step b), by adjusting the depth of the inlet-side portions, substrate processing can be uniformly performed with high accuracy.

Specifically, it is preferable that the substrate is a semiconductor substrate having a diameter of 200 mm or more.

DESCRIPTION OF THE PREFERRED EMBODIMENTS

Hereinafter, embodiments of the present invention will be described with reference to the accompanying drawings.

First Embodiment

Figure 1:
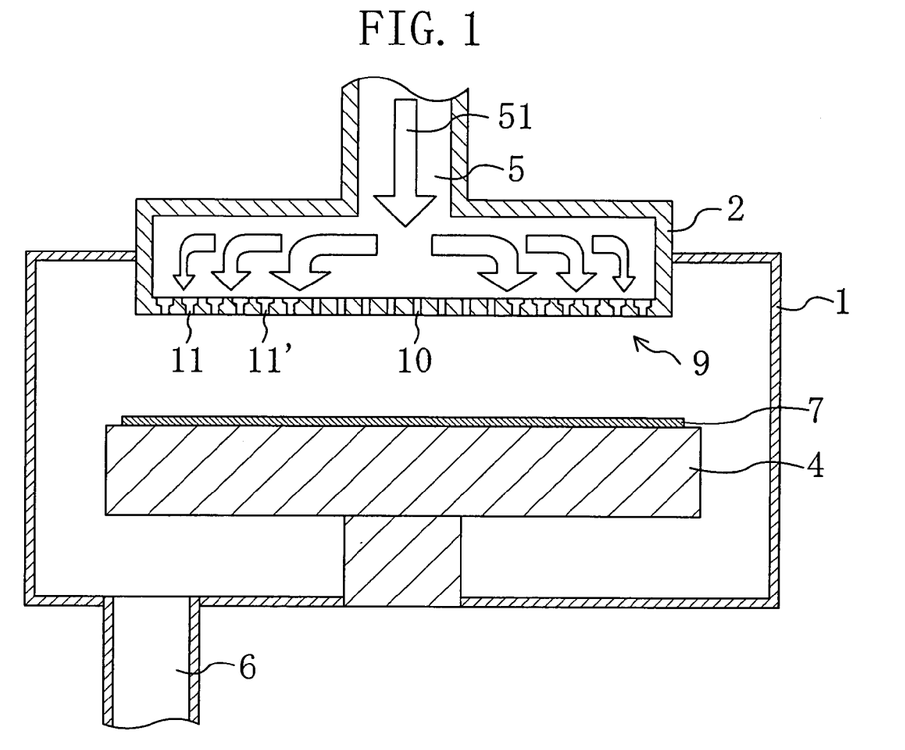
FIG. 1 is a cross-sectional view illustrating the inner structure of a chemical vapor deposition apparatus (substrate processing apparatus) according to a first embodiment of the present invention.

FIG. 1 is a cross-sectional view illustrating the inner structure of a chemical vapor deposition apparatus (substrate processing apparatus) according to a first embodiment of the present invention for use in fabricating a semiconductor integrated circuit. As shown in FIG. 1, the chemical vapor deposition apparatus includes a gas diffusion plate in which through holes are formed so as to have a different shape, compared to the known chemical vapor deposition apparatus of FIG. 6.

Specifically, the chemical vapor deposition apparatus of this embodiment includes a reaction chamber 1 for forming a thin film on a semiconductor substrate (substrate) 7 using a source gas (processing gas) 51, a shower head 2 for supplying the source gas 51 to the inside of the reaction chamber 1, to which a gas diffusion plate 9 is attached and in which a plurality of through holes for flowing the source gas 51 are formed and which has a plate shape, and a substrate support 4, provided in the reaction chamber 1, for placing the semiconductor substrate 7 so as to face the gas diffusion plate 9. In this example, the reaction chamber 1 has a structure allowing pressure reduction. Moreover, a gas inlet 5 for introducing a source gas is connected to upper part of the shower head 2. An outlet 6 connected to a discharging pump is connected to lower part of the reaction chamber 1. The substrate support 4 includes therein a heater for heating the semiconductor substrate 7 during film formation.

The shower head 2 is formed of a plate-shape body in which a hollow portion is provided therein. The removable gas diffusion plate 9 is attached to the lower part of the shower head 2. The gas diffusion plate 9 may be formed as a united body with a main body of the shower head 2.

A feature of the chemical vapor deposition apparatus of this embodiment is the shapes and locations of the plurality of through holes formed in the gas diffusion plate 9.

Figure 2A:
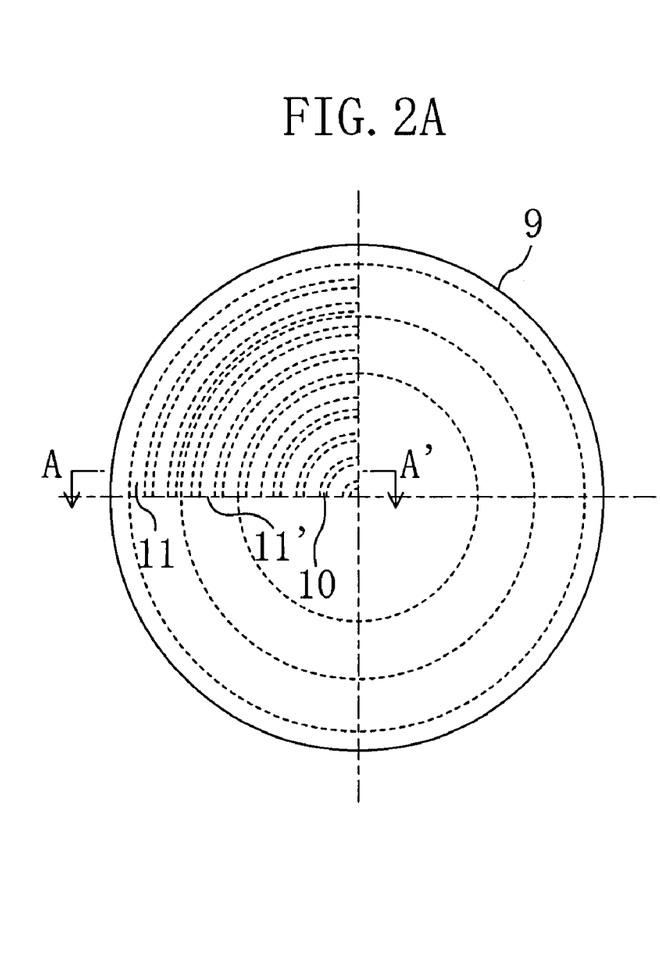
FIG. 2A is a plan view illustrating a gas diffusion plate used for the chemical vapor deposition apparatus of this embodiment.
Figure 2B:
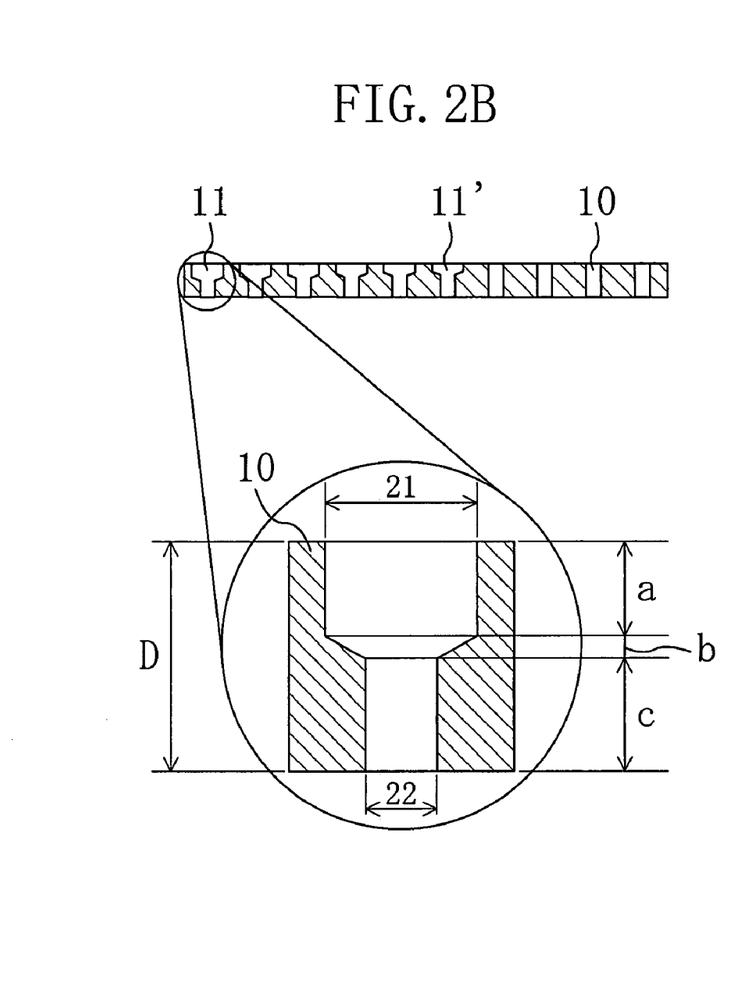
FIG. 2B is a cross-sectional view taken along the line A-A' in the gas diffusion plate of FIG. 2A.

FIG. 2A is a plan view illustrating a gas diffusion plate used for the chemical vapor deposition apparatus of this embodiment. FIG. 2B is a cross-sectional view taken along the line A-A' in the gas diffusion plate of FIG. 2A.

As shown in FIG. 2A, when viewed from the top, the gas diffusion plate 9 has a circular shape in accordance with the semiconductor substrate 7 in the form of a wafer. A preferable diameter of the gas diffusion plate 9 is in a range from 180 mm to 220 mm when the semiconductor substrate 7 has a diameter of 200 mm. In an actual case, several thousand circular through holes are formed in the gas diffusion plate 9 so as to spread concentrically from a center region of the gas diffusion plate 9 to a peripheral region thereof with substantially uniform density. In FIG. 2A, for simplification, a reduced number of through holes are illustrated and the through holes are illustrated only in part of the gas diffusion plate 9 accounting for ¼ of the entire plate. Herein, the center region means to be a region including center part of the gas diffusion plate 9 and located inside the peripheral region.

As shown in FIG. 1 and FIGS. 2A and 2B, through holes (gas supply holes) 10 are formed so as to be arranged concentrically (in a doughnut shape) in the center region and through holes 11 and 11' are formed so as to be arranged concentrically (in a doughnut shape) in the peripheral region located around the center region. The through holes 11' are provided in a more inner side than a concentric circle of the through holes 11. Of these through holes, the through holes 11 and 11' provided in the peripheral region of the gas diffusion plate 9 are formed so that the diameter and area of an inlet of each through hole are larger than the diameter and area of an outlet located in a surface of the gas diffusion plate 9 facing the substrate support 4. In contrast, the through holes 10 are formed in a pillar shape (cylindrical shape), i.e., inlet and outlet of each of the through holes 10 have the same diameter and area. The respective outlets of the through holes 10, 11 and 11' have the same diameter. Note that the diameters of the respective outlet of the through holes 10, 11 and 11' do not have to be the same as long as the flow rates of the source gas flowing through the through holes 10, 11 and 11' are equal. Herein, "an inlet of a through hole" means to be a portion of a through hole serving as an entrance for source gas flow and, specifically, in this embodiment, it means an opening connecting through to a hollow portion in the shower head 2. "An outlet of a through hole" means to be a portion of a through hole from which a source gas is discharged and, specifically, in this embodiment, it means an opening connecting through to the inside of the reaction chamber 1. In actual fact, the through holes 10 are formed so that the inlet and outlet of each of the through holes 10 have "substantially" the same area.

Moreover, as shown in FIG. 2B, each of the through holes 11 and the through holes 11' includes an inlet-side cylindrical portion (inlet-side portion), an outlet-side cylindrical portion (outlet-side portion) and a tapered connection portion for connecting the inlet-side portion and the outlet-side portion to each other. In this example, for the through holes 11 and the through holes 11', the inlet-side cylindrical portions thereof and the outlet-side cylindrical portions thereof have the same diameter. Where the depth of the inlet-side cylindrical portions of the through holes 11 and 11', the depth of the tapered connection portions thereof and the depth of the outlet-side cylindrical portions thereof are a, b and c, respectively, the depth D of the gas diffusion plate 9 is (a+b+c). The depth a of the inlet-side cylindrical portions of the through holes 11 is larger than the depth a of the inlet-side cylindrical portions of the through holes 11'.

The following is a specific example of dimensions of the above-described through holes. In the gas diffusion plate 9, the through holes 10 provided in a region thereof extending outwardly from the center of the gas diffusion plate 9 by 60 mm have an inlet with a diameter of 0.5 mm and an outlet with a diameter of 0.5 mm. Moreover, in the gas diffusion plate 9, the through holes 11' provided in a region thereof extending from a point 60 mm distant from the center thereof to a point less than 80 mm distant from the center thereof includes an inlet-side cylindrical portion with a diameter of 0.75 mm and a depth a of 3.0 mm, an outlet-side cylindrical portion with a diameter of 0.5 mm and a depth c of 2.0 mm, and a tapered connection portion having a depth b of 1.0 mm. Furthermore, in the gas diffusion plate 9, the through holes 11 provided in a region thereof extending from a point 80 mm distant from the center thereof to a point less than 100 mm distant from the center thereof includes an inlet-side cylindrical portion with a diameter of 0.75 mm and a depth a of 4.0 mm, an outlet-side cylindrical portion with a diameter of 0.5 mm and a depth c of 1.0 mm and a tapered connection portion with a depth b of 1.0 mm.

Note that the above-described dimensions are of an example. Especially, the depth a is not limited to the above-described values but may be set to be 0 mm, i.e., the inlet may be located at the tapered connection portion, or may be set to be some other value. Specifically, it is preferable to set the depth a to be within a range from 0.05 mm to a value equal to or less than ½ of the thickness of the plate.

When a film is formed using the chemical vapor deposition apparatus of this embodiment, the source gas 51 introduced from the gas inlet 5 is laterally diffused in the hollow portion of the shower head 2. Subsequently, the source gas 51 is supplied from the through holes 10, 11 and 11' formed in the gas diffusion plate 9 onto the heated semiconductor substrate 7. The pressure of the inside of the reaction chamber 1 is reduced by the pump in advance.

Figure 3:
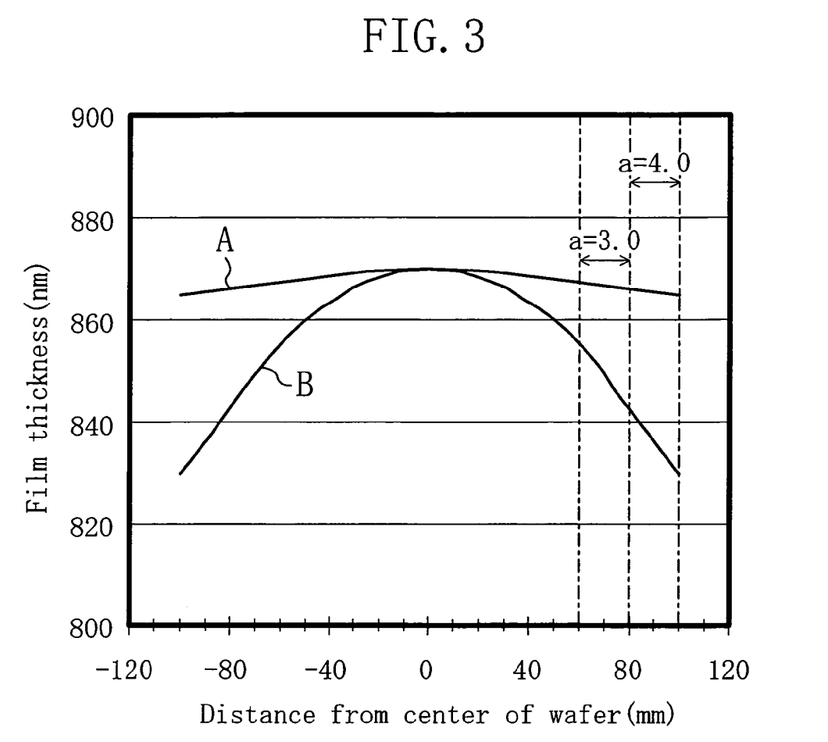
FIG. 3 is a graph showing a film thickness distribution (curve A) obtained when a silicon oxide film is formed on a semiconductor substrate using the chemical vapor deposition apparatus of this embodiment shown in FIG. 1 and a film thickness distribution (curve B) obtained when a silicon oxide film is formed using the known chemical vapor deposition apparatus.

FIG. 3 is a graph showing a film thickness distribution (curve A) obtained when a silicon oxide film was formed on a semiconductor substrate using the chemical vapor deposition apparatus of this embodiment shown in FIG. 1 and a film thickness distribution (curve B) obtained when a silicon oxide film was formed using the known chemical vapor deposition apparatus. In both cases, a silicon oxide film was formed in the following manner. With the semiconductor substrate 7 placed on the substrate support 4, TEOS (tetraethylorthosilicate) gas, ozone gas, TEPO (triethyl phosphate) gas and TEB (triehylboron) gas were flown into the reaction chamber 1 while the semiconductor substrate 7 was heated to 400° C. so that the above-described process gases are brought into thermal reaction, thereby forming a BPSG film on the semiconductor substrate 7.

As clearly shown in FIG. 3, in the known device, the film thickness uniformity (variation in film thickness) exceeded 3%. In contrast, in a chemical vapor deposition apparatus equipped with the gas diffusion plate of this embodiment, the film thickness uniformity was improved to 1.2%. In this case, the film thickness uniformity was obtained by 100×((variation in film thickness)/(average film thickness))/2 (%), i.e., 100×((maximum film thickness−minimum film thickness)/(average film thickness for measurement points))/2 (%).

As described above, in the known chemical vapor deposition apparatus (see FIG. 6), the amount of the source gas 101 supplied from through holes formed in the center region of the gas diffusion plate 108 and the amount of the source gas supplied from through holes formed in the peripheral region of the gas diffusion plate 108 were different from each other. Accordingly, a thickness of a film formed on a wafer has poor uniformity. Therefore, conventionally, film thickness uniformity has been improved by modification of the diameter of the through holes in the peripheral portion while keeping the pillar shape of the through holes in the peripheral portion.

In contrast, in the chemical vapor deposition apparatus of this embodiment, the through holes 11 and 11' are formed in the peripheral region of the gas diffusion plate 9 so that the diameter of an inlet of each of the through holes is larger than the diameter of an outlet thereof and also the through holes 10 are formed in the center region of the gas diffusion plate 9 so as to have a cylindrical shape with an inlet and outlet having the same diameter. Thus, compared to the known apparatus, the amount of the source gas 51 supplied from the gas diffusion plate 9 is uniform in the plate. Therefore, as shown in FIG. 3, using the chemical vapor deposition apparatus of this embodiment, it is possible to form a film with a uniform thickness, compared to the known apparatus.

At present, although no positive reason why the gas diffusion plate of this embodiment improves the uniformity of film thickness has been clearly shown, the improvement in uniformity of film thickness due to the gas diffusion plate can be explained as follows. To grow a film with a uniform thickness over an entire semiconductor substrate, basically, the flow rate of a source gas discharged from a gas diffusion plate has to be uniform. For this reason, through holes are formed in a peripheral region of the gas diffusion plate so that an inlet of each of the through holes has a larger diameter than the diameter of an inlet of each of through holes located in a center region of the gas diffusion plate. Thus, a larger amount of a source gas of which the density is slightly reduced in the peripheral region of the hollow portion can be taken into the through holes formed in the peripheral regions. In the above-described manner, the amount of a source gas passing through the through holes can be corrected. Also, the diameter of inlets of the through holes is set to be larger than the diameter of outlets of the through holes and, furthermore, respective depths of inlet-side cylindrical portions of the through holes are set to be certain values, respectively, so that a resistance against gas flowing the through hole is determined. Accordingly, the flow rate of a gas discharged can be also corrected. The above-described two effects synergistically work and thus allow the chemical vapor deposition apparatus to perform very precise control over the flow rate of gas, which the known technique could not achieve.

It seems that increasing the flow rate of a gas discharged from the peripheral region of the gas diffusion plate to the reaction chamber can be increased to a equal level to the flow rate of a source gas discharged from the center region by merely increasing the diameter of the through holes in the peripheral region of the gas diffusion plate with very high precision like in the known technique. By this method, however, it is practically difficult to control the flow rate. Holes are formed in the gas diffusion plate using a normal drill and processing accuracy is influenced by variation in the diameter of the drill used in forming the holes. It has been understood from results of experiments by the inventors that to control uniformity of a film deposited by increasing the diameter of through holes formed in the peripheral region of the gas diffusion plate, the diameter has to be processed with precision to 0.1 mm or less. However, there is no drill with a diameter assured with this precision and it is difficult to actually control uniformity of film thickness by this method. To cope with this, as in this embodiment, if (1) the diameter of inlets of the through holes formed in the peripheral region of the gas diffusion plate is increased to a larger value than the diameter of outlets thereof, (2) the depth of the inlet-side cylindrical portion of a through hole is changed, and (3) the through hole with a shape changed in (1) and (2) are made to spread with a proper distribution, fine control over gas supply can be performed and uniformity of film thickness can be improved even with not so high processing accuracy of the through hole opening.

Note that in the gas diffusion plate 9 of this embodiment, the diameters of inlets of all of the through holes are set to be larger than the diameters of outlets of thereof. In this case, the through holes are formed so that the depth of the inlet-side cylindrical portion of the through hole is small in the center region and large in the peripheral region in the gas diffusion plate 9. Alternatively, the through holes may be formed so that the difference between the diameter of the gas inlet cylindrical portion of a through hole and the diameter of an outlet-side cylindrical portion thereof is larger in the peripheral region located around the center region than in the center region or a region close to the center region in the gas diffusion plate 9.

Moreover, the depth a of the inlet-side cylindrical portion of a through hole formed in the peripheral region of the gas diffusion plate 9 is not limited to two variations. The depth a may be increased stepwise in a direction from the center outward.

When film formation for a semiconductor integrated circuit is performed using the chemical vapor deposition apparatus of this embodiment, to satisfy predetermined film thickness uniformity required for fabrication process, distribution for the through holes 10, 11 and 11' is determined and the respective diameters and respective depths of the inlet-side and outlet-side cylindrical portions of the through holes are properly set. Then, the gas diffusion plate is placed in the chemical vapor deposition apparatus and film formation is started. Specifically, when a deposited film is an interconnect interlevel insulation film made of a silicon oxide film, an organic silicate film or the like, a tungsten metal film for a tungsten plug to fill a contact hole or the like, a film with a film uniformity of 3% or less is deposited and then a surface of the film is planarized by chemical mechanical polishing (CMP). Thus, planarization can be performed with very high controllability.

The gas diffusion plate of this embodiment is preferably used also for a substrate processing apparatus for dry etching. In this case, a shower head similar to the shower head including a gas diffusion plate of FIG. 1 is used and an etching gas is introduced from gas inlets. With use of the gas diffusion plate of this embodiment, variation in supply of the etching gas is suppressed in the gas diffusion plate. Thus, nonuniformity on an upper surface of a wafer substrate can be suppressed.

Second Embodiment

Figure 4:
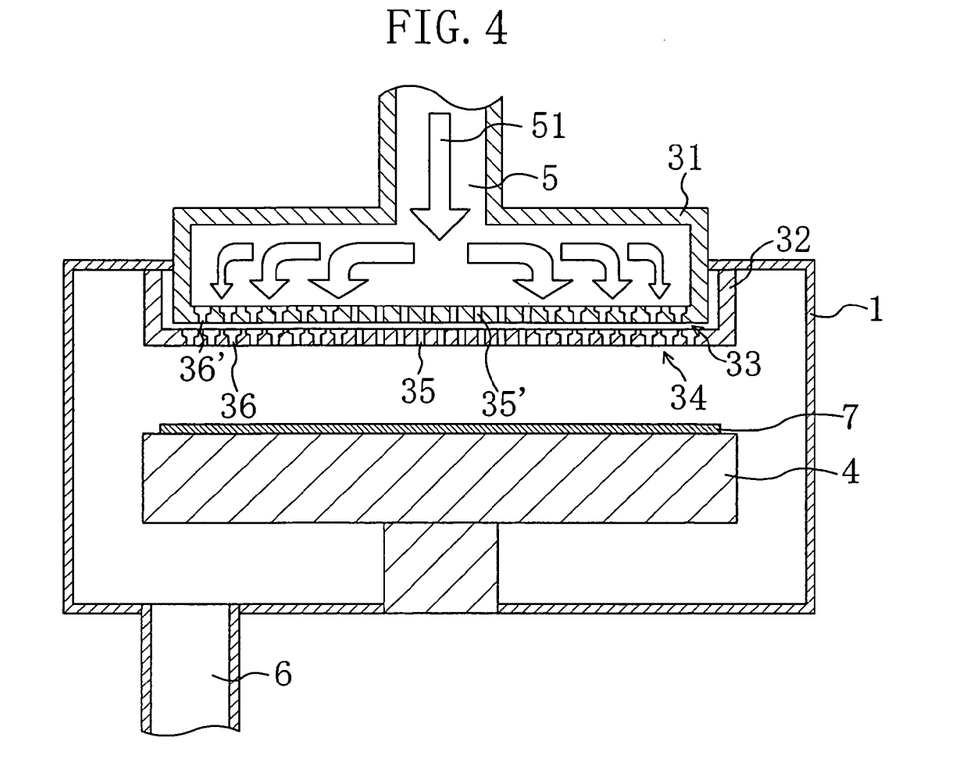
FIG. 4 is a cross-sectional view illustrating the internal structure of a chemical vapor deposition apparatus according to a second embodiment of the present invention.

FIG. 4 is a cross-sectional view illustrating the internal structure of a chemical vapor deposition apparatus according to a second embodiment of the present invention. The structure of the chemical vapor deposition apparatus of this embodiment is generally the same as that of the chemical vapor deposition apparatus of the first embodiment, but shower heads 2 for discharging a source gas serving as a film formation material are doubly provided. The gas diffusion plate of the first embodiment is used for each of the shower heads 2. The chemical vapor deposition apparatus of this embodiment is characterized by this double shower head structure. In FIG. 4, each member of the chemical vapor deposition apparatus also shown in FIG. 1 is identified by the same reference numeral and therefore the description thereof will be omitted.

As shown in FIG. 4, in the chemical vapor deposition of this embodiment, a first shower head to which a first gas diffusion plate 33 is attached has a cylindrical plate shape with a hollow portion and has the same structure as that of the shower head 2 (see FIG. 1) of the first embodiment. Specifically, the first gas diffusion plate 33 is attached to lower part of the first shower head 31, through holes 35' are formed in a center region of the first gas diffusion plate 33 and through holes 36' are formed in a peripheral portion of the first gas diffusion plate 33 surrounding the center region. The through holes 36' are formed so that the diameter and area of an inlet of each of the through holes 36' are larger than the diameter and area of an outlet thereof from which a source gas is discharged. In contrast, each of the through holes 35' is formed in a pillar (cylindrical) shape so that the diameter and area of an inlet of each of the through holes 35' are equal to the diameter and area of an outlet thereof, respectively. The outlets of the through holes 35' and 36' have the same diameter.

Moreover, the chemical vapor deposition apparatus of this embodiment includes a second gas diffusion plate 34. A second shower head 32 is further provided in the chemical vapor deposition apparatus so as to surround the lower part of the first shower head 31. The second shower head 32 supplies a source gas 51 discharged from the first shower head 31 to a semiconductor substrate 7. The second gas diffusion plate 34 has the same structure as the structure of the first gas diffusion plate 33. Specifically, though holes 35 having a cylindrical shape are provided in a center region of the second gas diffusion plate 34 and through holes 36 are provided in a peripheral portion of the second gas diffusion plate 34. The through holes 36 are formed so that the diameter and area of an inlet of each of the through holes 36 are larger than the diameter and area of an outlet thereof facing a substrate support 4. In contrast, the through holes 35 are formed in a pillar (cylindrical) shape so that the diameter and area of an inlet of each of the through holes 35 are equal to the diameter and area of an outlet thereof, respectively. Moreover, each of the through holes 36 includes an inlet-side cylindrical portion, an outlet-side cylindrical portion and a tapered connection portion. The depth of the inlet-side cylindrical portions becomes larger at a greater distance from the center region.

With the chemical vapor deposition apparatus of this embodiment having the above-described structure, variation in source gas supply in the gas diffusion plate can be further reduced. Therefore, according to this embodiment, a film can be formed over a semiconductor substrate so as to have uniform thickness, compared to the known chemical vapor deposition apparatus.

Note that in the chemical vapor deposition apparatus of this embodiment, each of the first gas diffusion plate 33 and the second gas diffusion plate 34 has a similar structure to the structure of the gas diffusion plate of the first embodiment. However, the structure described in the first embodiment may be used only for one of the first gas diffusion plate 33 and the second gas diffusion plate 34 and the known gas diffusion plate in which a large number of through holes having the same cylindrical shape are formed throughout a surface thereof may be used for the other one of the first and second gas diffusion plates 33 and 34. Moreover, through holes formed in the first gas diffusion plate 33 and the second gas diffusion plate 34 may have some other shape than the shape shown in FIG. 2. For example, all of the through holes may be formed so that the diameter of each of the through holes is larger at the inlet side than at the outlet side throughout of a gas diffusion plate.

Figure 5:
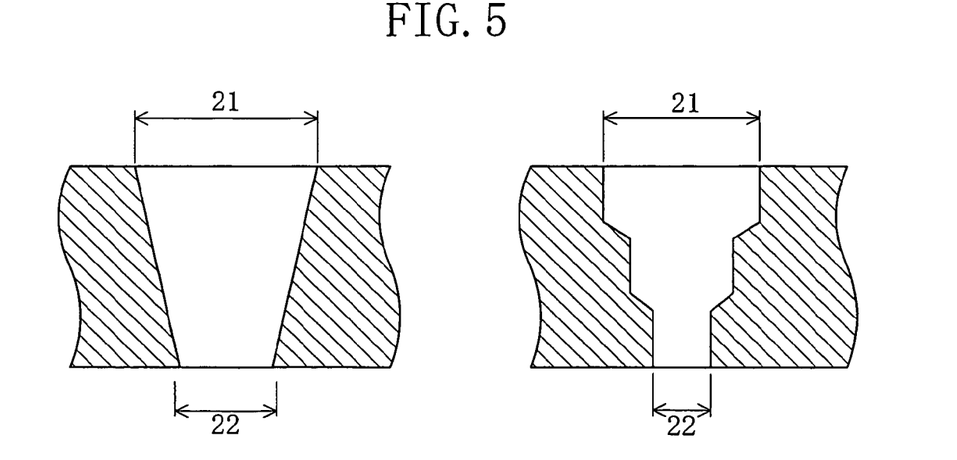
FIG. 5 is a cross-sectional view illustrating through holes formed in a gas diffusion plate according to the present invention.

FIG. 5 is a cross-sectional view illustrating through holes formed in the gas diffusion plate of this embodiment. As shown in the left-hand side of FIG. 5, in the peripheral portion of each gas diffusion plate of the first and second embodiments, the through holes may be formed in a tapered shape so that a diameter 21 of an inlet of each of the through holes is larger than the diameter 22 of an outlet thereof. Alternatively, as shown in the right-hand side of FIG. 5, in the peripheral region of the gas diffusion plate, the through holes may be formed so that a diameter 21 of an inlet of each of the through holes is larger than the diameter 22 of an outlet thereof and each of the through holes includes three or more stages of cylindrical portions. As described above, if through holes are formed in the peripheral region of the gas diffusion plate so that an area of an inlet of each of the through holes is larger than an area of an outlet thereof, the shape of through holes is not limited and uniformity in substrate processing can be improved. Considering the shape of a drill, through holes having a cross-sectional view of FIG. 2 can be preferably processed in a more simple manner. Moreover, since the through holes formed in the gas diffusion plate are normally processed by a drill, the shape of through holes formed in a gas diffusion plate is usually a circular shape. However, the through holes may be formed to have some other horizontal shape. Also, in that case, the through holes described in the above-described embodiments are formed so that an area of an inlet of each of the through holes is larger than an area of an outlet thereof. Thus, an inlet-side portion and an outlet-side portion become an inlet-side pillar portion (inlet-side cylindrical portion) and an outlet side pillar potion (outlet-side cylindrical portion) each of which has a horizontal cut with a predetermined shape, respectively.

The chemical vapor deposition apparatus of the present invention can be used in a more effective manner, particularly, when the diameter of a semiconductor substrate is increased to, for example, 200 mm, 300 mm and 450 mm. Moreover, in the above-described embodiments, the case of thermal reaction type chemical deposition has been described. However, even in an apparatus used in some other process step, a gas diffusion plate for supplying a process gas may have the same structure as the structure of the gas diffusion plate of FIG. 1 or FIG. 4. In such a case, a gas diffusion plate according to the present invention can be used in common in a plasma CVD apparatus, a dry etching apparatus, various types of ashing apparatus, some other plasma surface processing apparatus, a surface gas processing apparatus and the like. In the above-described embodiments, the example where in substrate processing using a gas diffusion plate of the present invention, the thickness of a film obtained in film formation has been used as a parameter to be an index in controlling uniformity has been described. However, not only film thickness but also a parameter such as etching rate, etching amount, ashing amount, film growth rate and the like may be used as an index of uniformity of processing in a substrate surface as necessary.

The gas diffusion plate of the present invention described above can be used for a substrate processing apparatus for performing film formation, dry etching, plasma etching or the like in fabricating a semiconductor integrated circuit. Moreover, the gas diffusion plate of the present invention can be used for manufacturing not only a semiconductor integrated circuit but also a product for which uniform processing is required.

What is claimed is:

1. A method for processing a substrate using a substrate processing apparatus including a reaction chamber for processing the substrate using a processing gas, a shower head which includes a gas diffusion plate having a plate shape and a plurality of through holes for passing the processing gas and which is for supplying the processing gas into the reaction chamber, and a substrate support which is provided in the reaction chamber and which is for placing the substrate so that the substrate faces the gas diffusion plate, the method comprising the process steps of:
   a) placing the substrate on the substrate support; and
   b) supplying the processing gas to the reaction chamber through the plurality of through holes formed in the gas diffusion plate to perform processing to the substrate,
   wherein the plurality of through holes are formed in both a center region of the gas diffusion plate and a peripheral region of the gas diffusion plate that surrounds the center region, and
   each of the plurality of through holes formed in the peripheral region of the gas diffusion plate has an inlet for the processing gas and an outlet for discharging and supplying the processing gas into the reaction chamber, an area of the inlet being larger than that of the outlet.

2. The method of claim 1, wherein each one of the through holes provided in the center region of the gas diffusion plate is formed in a pillar shape so that an area of an inlet thereof is substantially equal to an area of an outlet thereof.

3. The method of claim 2, wherein each one of the through holes provided in the peripheral region of the gas diffusion plate comprises an inlet-side portion including the inlet and an outlet-side portion including the outlet, each of the inlet- and outlet-side portions is formed in a pillar shape so as to have a certain opening area, and a depth of the inlet-side portion is larger at a greater distance from the center region.

4. The method of claim 3, wherein uniformity of a parameter for substrate processing as a result of processing the substrate is 3% or less.

5. The method of claim 4, wherein the plurality of through holes including the inlet-side portions with different depths from each other and provided in the peripheral region of the gas diffusion plate are arranged so that uniformity of a parameter for substrate processing becomes 3% or less.

6. The method of claim 2 or 3, wherein the substrate is a semiconductor substrate having a diameter of 200 mm or more.

7. The method of claim 4, wherein the parameter for substrate processing is at least any one of a film thickness in a film deposition, etching rate or etching amount in dry etching, or ashing amount in ashing.

8. The method of claim 2, wherein uniformity of a parameter for substrate processing as a result of processing the substrate is 3% or less.

9. The method of claim 3, wherein a depth of the inlet-side portion of one of the plurality of through holes provided in the peripheral portion of the gas diffusion plate is more than 0 mm and 1/2 or less of a thickness of the gas diffusion plate.

10. A method for processing a substrate using a substrate processing apparatus including a reaction chamber for processing the substrate using a processing gas, a first shower head which includes a first gas diffusion plate having a plate shape and a plurality of first through holes for passing the processing gas and which is for supplying the processing gas into the reaction chamber, a second shower head which includes a second gas diffusion plate having a plate shape and a plurality of second through holes for passing the processing gas and which surrounds the first shower head and which is for supplying the processing gas into the reaction chamber, and a substrate support which is provided in the reaction chamber and which is for placing the substrate so that the substrate faces the second gas diffusion plate, the method comprising the process steps of:
  a) placing the substrate on the substrate support; and
  b) supplying the processing gas to the reaction chamber through the plurality of the first and second through holes respectively formed in the first and second gas diffusion plates to perform processing to the substrate,
wherein the plurality of the through holes are formed at least in a center region of one of the first and second gas diffusion plates and a peripheral region of said one gas diffusion plate that surrounds the center region, and
each of the plurality of the through holes formed in the peripheral region of said one gas diffusion plate has an inlet for the processing gas and an outlet for discharging and supplying the processing gas into the reaction chamber, an area of the inlet being larger than that of the outlet.

11. The method of claim 10, wherein in one of the first and second gas diffusion plates, each one of the plurality of the first and second through holes provided in a center region of said one gas diffusion plate is formed in a pillar shape so that an area of an inlet thereof is substantially equal to an area of an outlet thereof.

12. The method of claim 11, wherein in the other of the first and second gas diffusion plates, all the plurality of the first and second through holes provided in a center region of said one gas diffusion plate are formed in a pillar shape so that an area of an inlet thereof is substantially equal to an area of an outlet thereof.

13. The method of claim 11, wherein each one of the plurality of the first and second through holes provided in a peripheral region of one of the first and second gas diffusion plates comprises an inlet-side portion including the inlet and an outlet-side portion including the outlet, each of the inlet-side and outlet-side portions is formed in a pillar shape so as to have a certain opening area, and a depth of the inlet-side portion of one of the plurality of the through holes is larger at a greater distance from the center region of said one gas diffusion plate.

14. The method of claim 11, wherein uniformity of a parameter for substrate processing as a result of processing the substrate is 3% or less.

15. The method of claim 11, wherein the parameter for substrate processing is at least any one of a film thickness in a film deposition, etching rate or etching amount in dry etching, or ashing amount in ashing.

16. The method of claim 11 or 13, wherein the substrate is a semiconductor substrate having a diameter of 200 mm or more.

* * * * *

UNITED STATES PATENT AND TRADEMARK OFFICE
CERTIFICATE OF CORRECTION

| | | |
|---|---|---|
| PATENT NO. | : 7,368,398 B2 | Page 1 of 1 |
| APPLICATION NO. | : 11/255015 | |
| DATED | : May 6, 2008 | |
| INVENTOR(S) | : Toshio Matsubara et al. | |

It is certified that error appears in the above-identified patent and that said Letters Patent is hereby corrected as shown below:

On the title page of the patent, under Item "(56) References Cited", under "FOREIGN PATENT DOCUMENTS", delete the listing "JP   11-360143   A   12/1989".

Signed and Sealed this

Tenth Day of February, 2009

JOHN DOLL
*Acting Director of the United States Patent and Trademark Office*